(12) United States Patent
Kojima et al.

(10) Patent No.: US 7,316,937 B2
(45) Date of Patent: Jan. 8, 2008

(54) METHOD FOR MANUFACTURING A SOLID-STATE IMAGE SENSING DEVICE, SUCH AS A CCD

(75) Inventors: Kazuaki Kojima, Mizuho (JP); Minoru Hamada, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 31 days.

(21) Appl. No.: 10/880,413

(22) Filed: Jun. 28, 2004

(65) Prior Publication Data
US 2004/0266051 A1 Dec. 30, 2004

(30) Foreign Application Priority Data
Jun. 30, 2003 (JP) ............... 2003-187695

(51) Int. Cl.
*H01L 21/00* (2006.01)
(52) U.S. Cl. .................... 438/60; 438/33; 438/75; 438/114; 257/E27.15; 257/E27.41
(58) Field of Classification Search ............. 438/33, 438/68, 60, 75, 78, 114, 144, 458, 460; 257/E27.15, 257/E27.41
See application file for complete search history.

(56) References Cited

U.S. PATENT DOCUMENTS

| | | | |
|---|---|---|---|
| 5,122,481 A | | 6/1992 | Nishiguchi |
| 6,428,650 B1 * | | 8/2002 | Chung ............... 156/250 |
| 6,455,774 B1 * | | 9/2002 | Webster ............ 174/52.4 |
| 6,492,699 B1 * | | 12/2002 | Glenn et al. ........ 257/433 |
| 6,526,653 B1 * | | 3/2003 | Glenn et al. ........ 29/830 |
| 6,743,696 B2 * | | 6/2004 | Jeung et al. ........ 438/458 |
| 6,791,076 B2 * | | 9/2004 | Webster ............ 250/239 |
| 6,882,368 B1 * | | 4/2005 | Suda ............... 348/340 |
| 6,906,405 B2 * | | 6/2005 | Ono ................ 257/680 |
| 7,001,797 B2 * | | 2/2006 | Hashimoto ......... 438/113 |
| 7,030,916 B2 * | | 4/2006 | Aotsuka ............ 348/272 |
| 7,083,999 B2 * | | 8/2006 | Hashimoto ......... 438/60 |
| 2003/0058357 A1 * | | 3/2003 | Aotsuka ............ 348/272 |
| 2004/0012698 A1 * | | 1/2004 | Suda et al. ......... 348/315 |
| 2004/0036078 A1 * | | 2/2004 | Kondo .............. 257/80 |

OTHER PUBLICATIONS

Kei Kinoshita et al., "Minority Carrier Lifetime Measurement of Si Wafers Lapped by the Mechanical Grinding", pp. 102-107.
"Drop of Minority Carrier Life Time with Silicon Wafer Surface due to Silicon Back Surface Damage due to Grinding", Smiels SEZ, Inc. Application Group, Sep. 30, 1996.
"Minority Carrier Lifetime Measurement of Si Wafers Lapped by the Mechanical Grinding" The Japan Society of Applied Physics, Sep. 1996. (w/out translation).

* cited by examiner

*Primary Examiner*—Fernando L. Toledo
(74) *Attorney, Agent, or Firm*—Hogan & Hartson LLP (57) ABSTRACT

Light detecting elements are formed in areas marked off by scribe lines on a semiconductor substrate, and color filters are deposited in such a manner as to cover the formed areas of the light detecting elements, and then an infrared cut-off filter, on which an infrared reflecting film is vapor-deposited in such a manner as to cover the formed areas of the light detecting elements, is firmly fixed to the surface of the semiconductor substrate through the interposition of a translucent resin layer, such as an epoxy adhesive, to thereby form a multilayered structure, and this multilayered structure is diced along scribe lines.

2 Claims, 10 Drawing Sheets

SCRIBE LINE

SCRIBE LINE

Fig.14B

METHOD FOR MANUFACTURING A SOLID-STATE IMAGE SENSING DEVICE, SUCH AS A CCD

CROSS REFERENCE TO RELATED APPLICATION

The priority application Number JP2003-187695 upon which this patent application is based is hereby incorporated by reference.

BACKGROUND OF THE INVENTION

1. Field of the Invention

The present invention relates to a method for manufacturing a solid-state image sensing device, such as a CCD.

2. Description of the Related Art

An infrared cut-off filter for removing infrared components from incident light is indispensable in color solid-state image sensing devices, which are commonly used in TV cameras and digital still cameras. Without this infrared cut-off filter, because infrared light is contained in the incident light, the solid-state image sensing device is sensitive to infrared light, and therefore the output of the solid-stage image sensing device includes not only visible light components but also error components from the infrared light. This is conspicuous in the light rays from heat sources, such as the light of an electric bulb, which makes color reproduction difficult.

For the reason described above, in conventional solid-state image sensing devices, an infrared cut-off filter is attached to the surface of the package, which adds to the increase in assembly man-hours. The present invention has been made to solve the above shortcoming, and has as its object to provide a method for manufacturing a solid-state image sensing device fitted with an infrared cut-off filter without increasing the assembling man-hours.

SUMMARY OF THE INVENTION

According to the present invention, there is provided a method for manufacturing a solid-state image sensing device which comprises a first process for forming light detecting elements in respective areas marked off by scribe-lines on the surface of a semiconductor substrate and depositing color filters in such a manner as to cover the formed areas of the light detecting elements, a second process of forming a multilayered structure by firmly fixing an infrared cut-off filter covering the formed areas of the light detecting elements, and a third process for dividing the multilayered structure into partitions by cutting along the scribe-lines on the semiconductor substrate.

DESCRIPTION OF THE PREFERRED EMBODIMENTS

Figure 1:
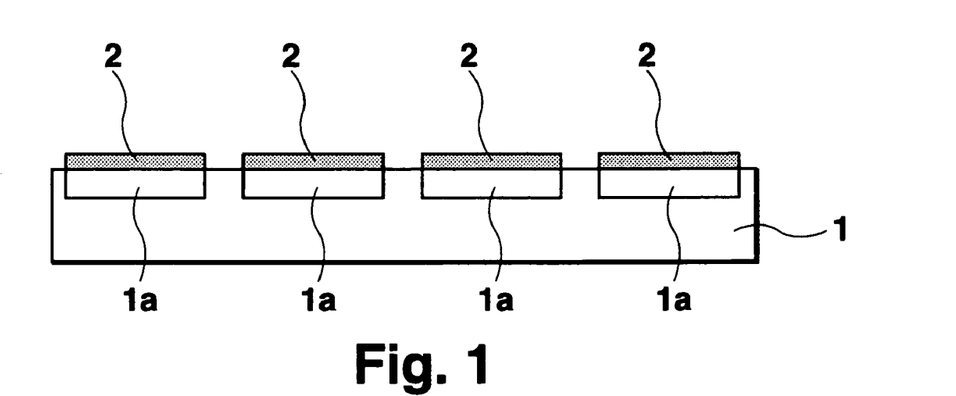
FIG. 1 shows a process of forming light detecting elements according to a first embodiment of the present invention.
Figure 2:
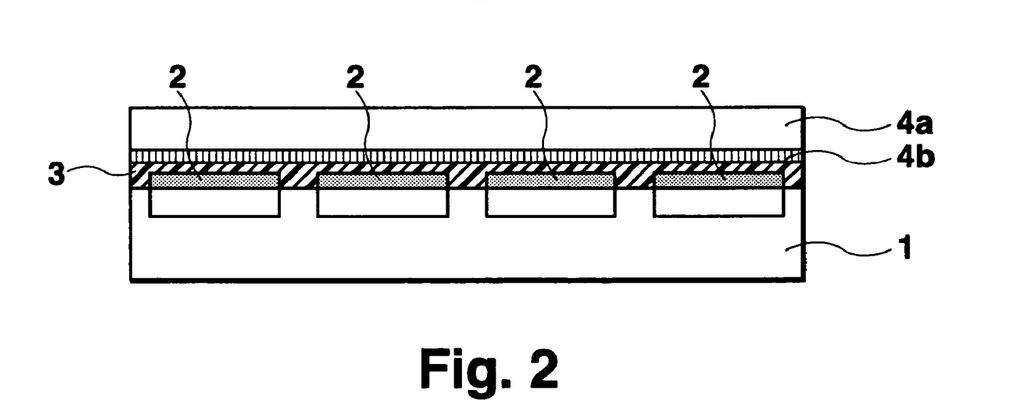
FIG. 2 shows a process of depositing an infrared cut-off filter according to the first embodiment of the present invention.
Figure 3:
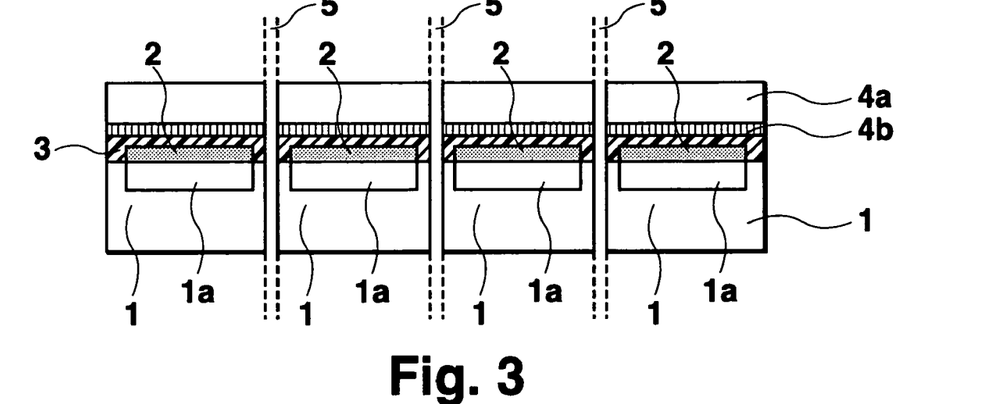
FIG. 3 shows a process of dicing into elements according to the first embodiment of the present invention.
Figure 4:
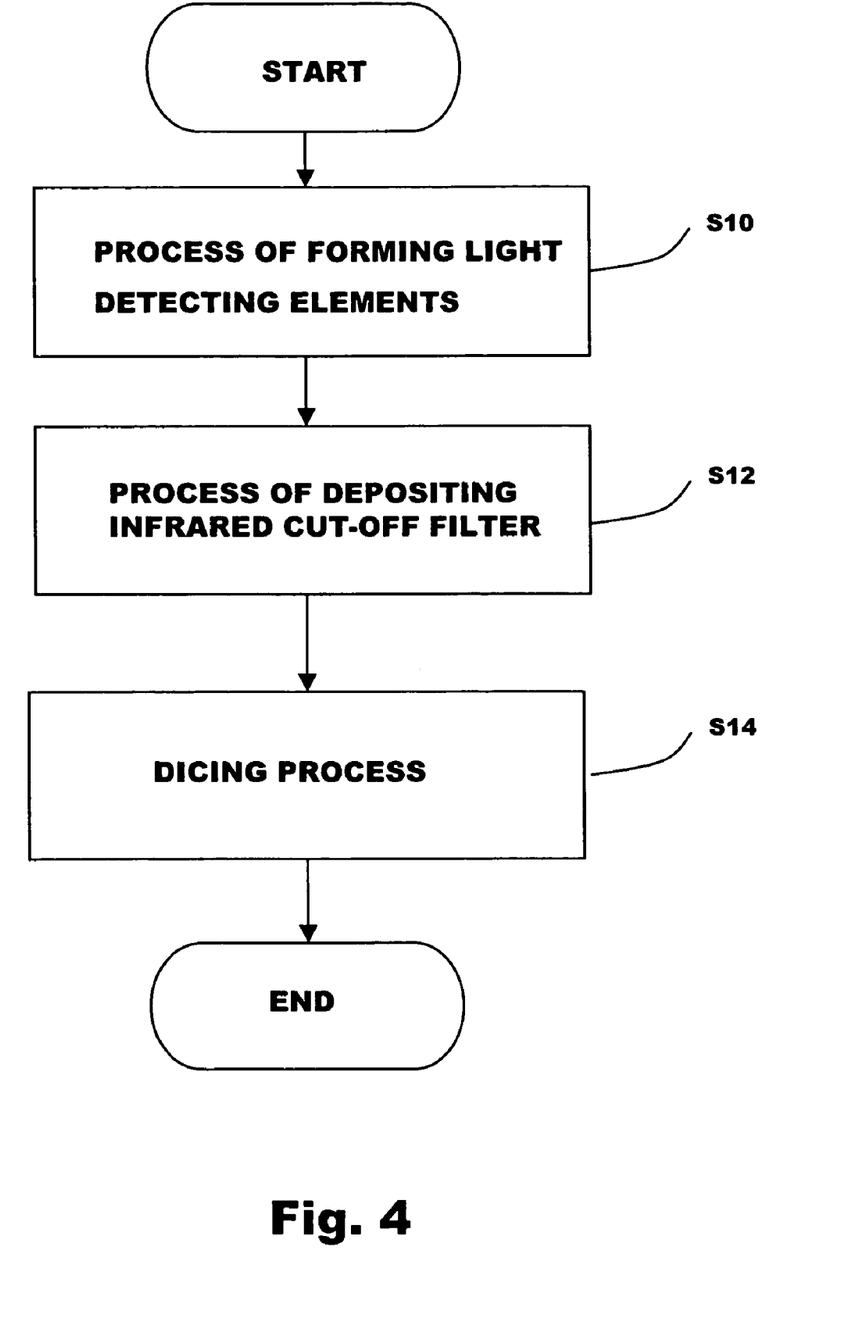
FIG. 4 is a flowchart showing the first embodiment of the present invention.

FIGS. 1 to 3 are sectional views in the order of processes showing a first embodiment in a process for manufacturing a solid-state image sensing device of the present invention. The method of this embodiment comprises a process of forming a light detecting element, a process of depositing layers to form an infrared cut-off filter, and a dicing process as shown in the flowchart in FIG. 4.

In the process of forming a light detecting element in Step S10, as shown FIG. 1, light detecting elements are formed in respective areas 1a which are marked off by scribe lines on the surface of a semiconductor substrate 1. The color filters 2 are deposited over the areas 1a where the light detecting elements have been formed. The semiconductor substrate 1 may be formed of an ordinary semiconductor material, such as silicon, gallium arsenide, for example. An integrated circuit, such as a CCD as a light detecting device, can be formed by a well-known semiconductor process.

In the process of depositing the infrared cut-off filter in Step S12, as shown in FIG. 2, a translucent resin layer 3, such as an epoxy adhesive, on one side thereof firmly fixes the infrared cut-off filter in such a manner as to cover the formed areas of the light detecting elements 1a. The reason why a resin adhesive was used in fixing the infrared cut-off filter as described above is because it is impossible to vapor-deposit an infrared reflecting film 4b of the infrared cut-off filter to the color filters 2, which are made of resin and cannot be handled in a high-temperature process. In this example, the infrared cut-off filter is formed by vapor-depositing the infrared reflecting film 4b on the surface of a transparent substrate 4a, such as a glass material or a plastic material. In this case, though the transparent substrate 4a was fixed on an upper surface of the infrared reflecting film 4b to prevent damage to the infrared reflecting film 4b, needless to say it is possible to fix the transparent substrate 4a in a position under the infrared reflecting film 4b. It is also possible to add another transparent substrate to the undersurface of the infrared reflecting film vapor-deposited to the undersurface of the transparent substrate. The infrared cut-off filter may be composed as a multilayered substrate by vapor-depositing the infrared reflecting film to the surface of the transparent substrate and also fixing another transparent substrate to the infrared reflecting film through the interposition of an epoxy adhesive. Instead of using the infrared reflecting film, it is also possible to form an infrared cut-off filter in a flat plate by using an infrared absorbing material.

Subsequently, though not illustrated, contact holes are formed and filled with electrodes with the electrode pads open at the surface to provide electrical connections between the light detecting elements in the solid-state image sensing device and the outside of the solid-state image sensing device.

In the dicing process in Step 14, as shown in FIG. 3, the multilayered structure thus obtained is divided into individual solid-state image sensing elements by cutting along the scribe lines. With this method, a large quantity of solid-state image sensing elements can be manufactured at low cost.

FIGS. 5 to 12 are sectional views in the order of processes showing a second embodiment in a method for manufacturing a solid-state image sensing device according to the present invention. The method of the second embodiment comprises a process of forming light detecting elements and internal wiring, a first process of forming a multilayered portion, a grinding process, a second process of forming a multilayered structure, a cutting process, a process of forming a metal film and terminals, and a dicing process.

Figure 5:
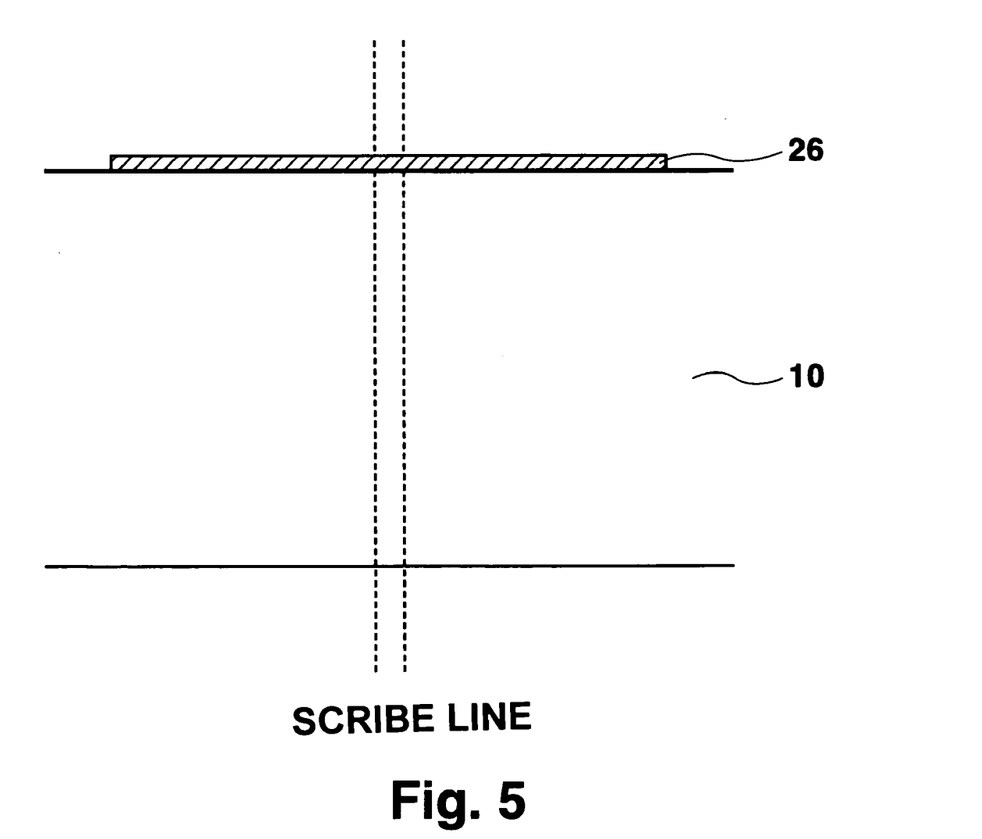
FIG. 5 shows a process of forming light detecting elements and internal wiring according to a second embodiment of the present invention.

In the process of forming light detecting elements in Step S16 and internal wiring in Step S18, light detecting elements are formed in areas marked off by scribe lines on the surface of a semiconductor substrate. Then, internal wiring 26 is formed through an intermediary of an oxide film extending along the border lines of adjacent light detecting elements, in other words, along the scribe lines on the surface of the semiconductor substrate 10 as shown in FIG. 5. The internal wiring 26 is electrically connected to the light detecting element through the contact hole formed in the oxide film. Further, though not illustrated, color filters are deposited in such a manner as to cover the light detecting elements in the formed areas of the light detecting elements.

Figure 6:
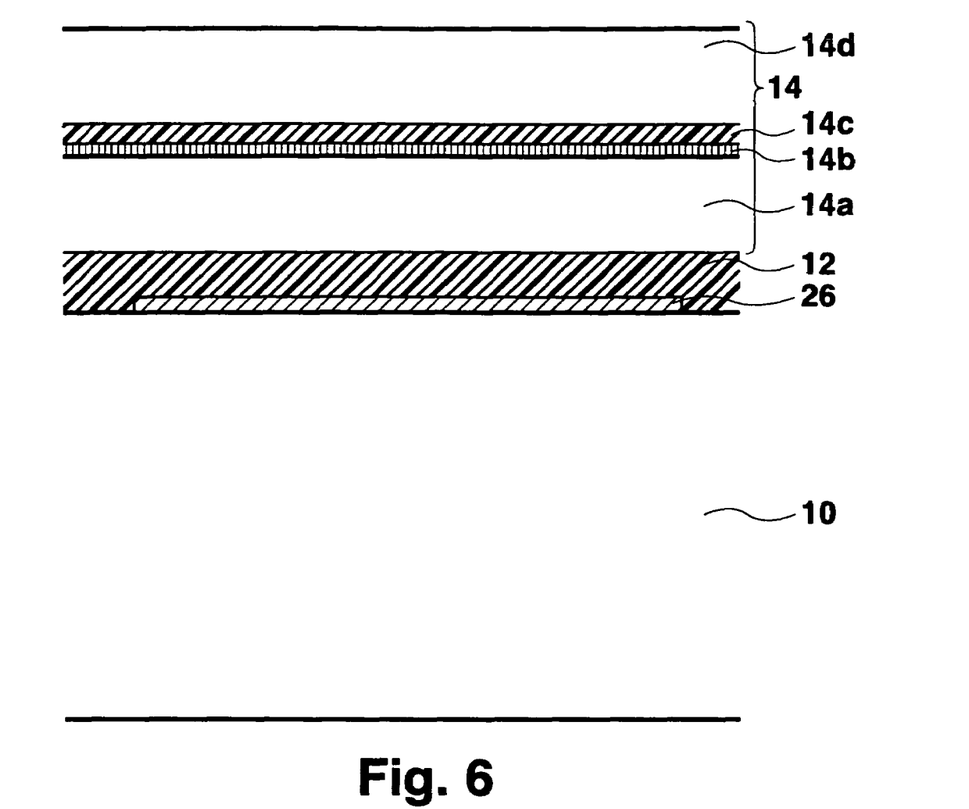
FIG. 6 shows a process of first forming a multilayered portion according to the second embodiment of the present invention.

In the first process of forming a multilayered portion in Step S20, an upper support base substrate 14 is firmly fixed by a resin layer 12, such as an epoxy adhesive, for example, to the surface of the semiconductor substrate 10 as shown in FIG. 6. In this example, an upper support base substrate 14 is formed in a multilayer stack by vapor-depositing an infrared reflecting film 14*b* on the upper surface of a transparent substrate 14*a*, and then firmly fixing a transparent substrate 14*d* to the upper surface of the infrared reflecting film 14*b* through the interposition of an epoxy adhesive 14*c*. However, the upper support base substrate 14 is not limited to the above-described structure and may be formed merely by vapor-depositing the infrared reflecting film to a surface of a transparent substrate of a glass material or a plastic material or may be formed as a flat transparent plate made of an infrared absorbing material.

Figure 7:
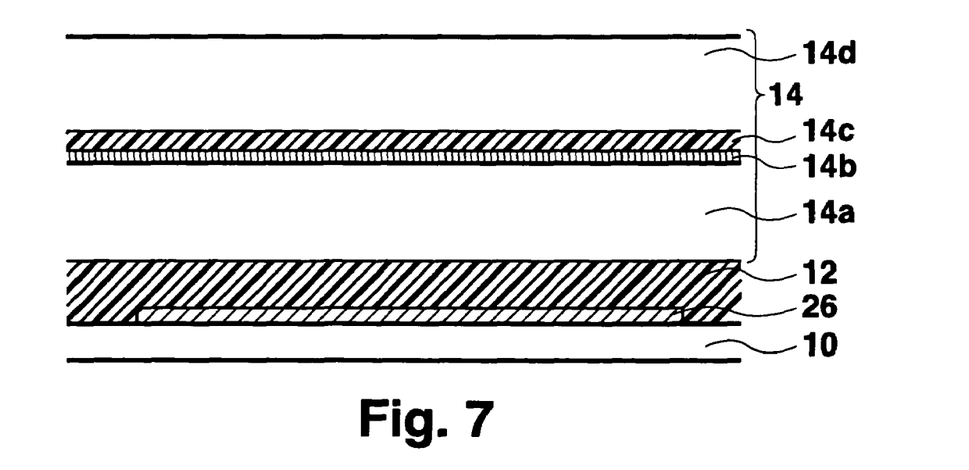
FIG. 7 shows a process of grinding according to the second embodiment of the present invention.
Figure 8:
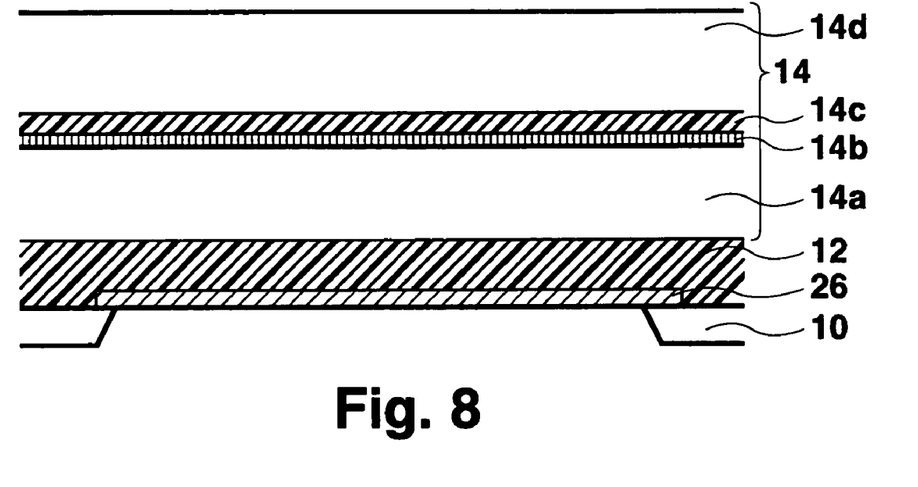
FIG. 8 shows a process of etching according to the second embodiment of the present invention.

In the grinding process in Step S22, as shown in FIG. 7, the semiconductor substrate 10 is removed from the rear side surface by mechanical grinding using a grinder to reduce the thickness of the semiconductor substrate 10. Then, as shown in FIG. 8, the semiconductor substrate 10 is removed from the rear side surface by etching along the scribe lines to expose the surface of the oxide film on which the internal wiring 26 was formed.

Figure 9:
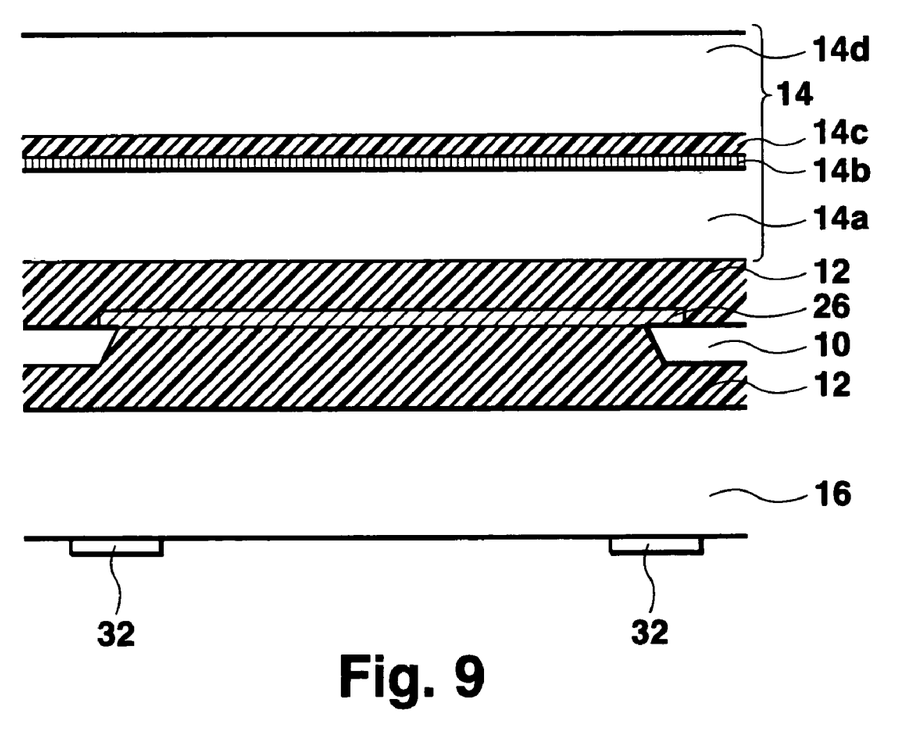
FIG. 9 shows a process of second forming a multilayered structure according to the second embodiment of the present invention.

In the second process of forming a multilayered structure in Step S24, a lower support base substrate 16 is firmly fixed to the rear side surface of the semiconductor substrate 10 with a resin layer 12, such as an epoxy adhesive, to thereby form a multilayered part as shown in FIG. 9. As the material for the lower support base substrate 16, a material may be selected from among materials applicable to packaging of semiconductor devices, such as glass, plastic or ceramics, for example. Then, a shock absorbing material 32 is formed at positions where ball-shaped terminals 20 are formed on the rear side surface of the lower support base substrate 16 in a subsequent process. Those pieces of shock absorbing material 32 act as the cushion to alleviate stress that acts on the ball-shaped terminals 20. As the material of the shock absorbing material 32, it is preferable to use flexible materials on which patterning can be performed, and it is more preferable to use a photosensitive epoxy resin.

Figure 10:
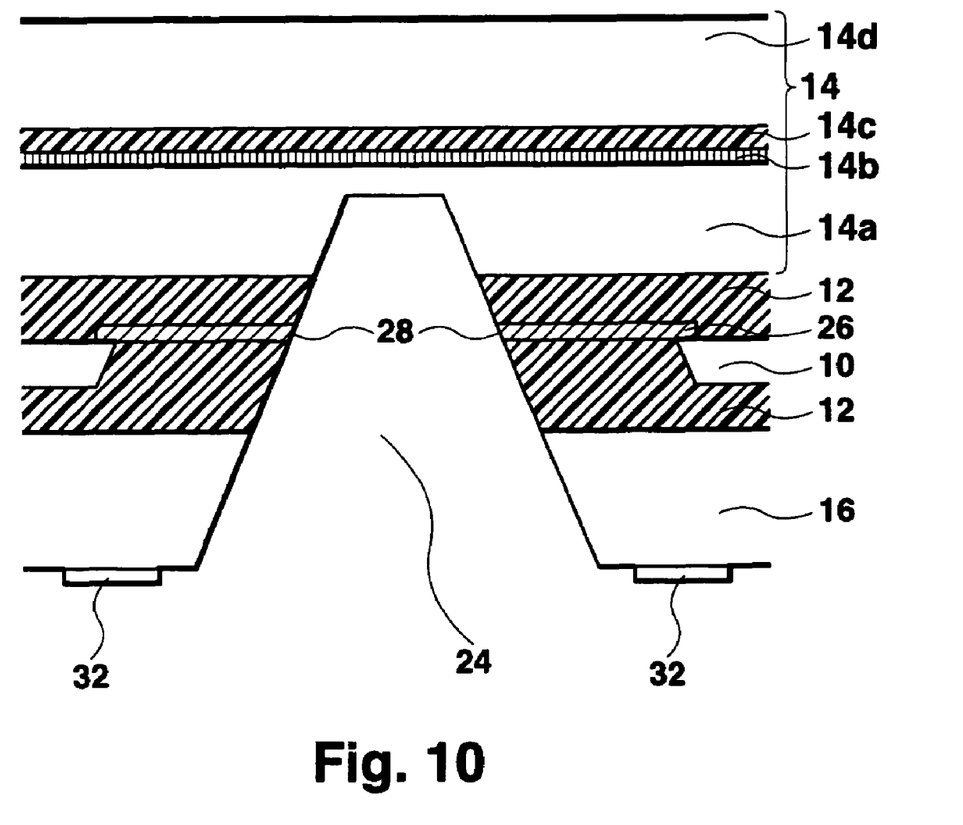
FIG. 10 shows a process of cutting according to the second embodiment of the present invention.

In the cutting process in Step S26, as shown in FIG. 10, a V-groove (notch) 24 is formed by a dicing saw or the like on the rear side surface of the lower support base substrate 16 gradually widening from the side of the lower support base substrate 16 and reaching into the upper support base substrate 14, with the result that the ends of the internal wiring 26 are exposed at the internal walls of groove 24.

Figure 11:
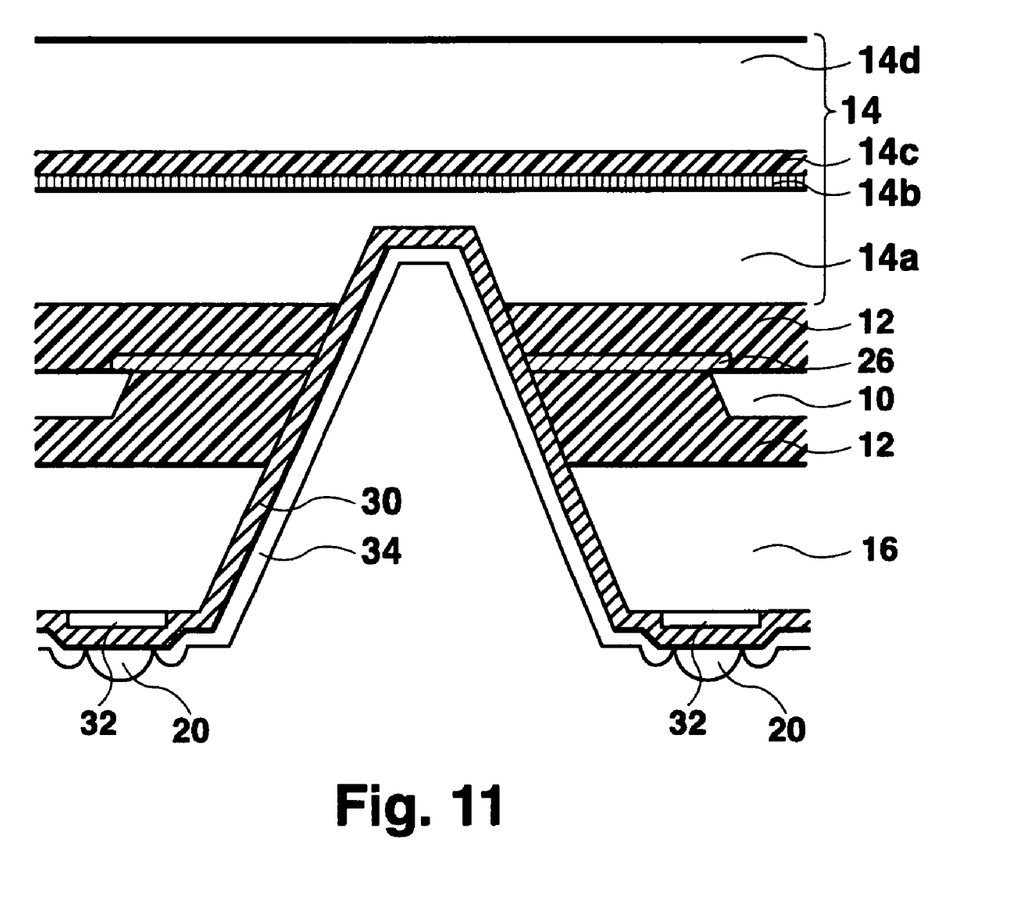
FIG. 11 shows a process of depositing a metal film and a process of forming terminals according to the second embodiment of the present invention.

In the process of depositing a metal film in Step S28 and the process of forming terminals in Step S30, as shown in FIG. 11, a metal film 30 is formed on the side of the lower support base substrate 16 of the groove 24, and the metal film 30 is deposited on the bottom wall and the side wall of the groove 24 and electrically connected to the internal wiring 26. After this, the metal film 30 is patterned to obtain a predetermined wiring pattern. For the material of the metal film 30, materials generally applicable to semiconductor devices, such as silver, gold, copper, aluminum, nickel, titanium, tantalum, tungsten, for example, can be used as the main material. If an electric resistance value or the workability of material of particular concern, it is preferable to use aluminum.

A protective film 34 is deposited in such a manner as to cover the areas other than the shock absorbing material 32 on the rear side surface of the lower support base substrate 16. For the protective film 34, because a material on which patterning can be performed is preferable, a photosensitive epoxy resin, for example, the same material as in the shock absorbing material 32, may be used. Next, ball-shaped terminals 20 as external terminals are formed on the shock absorbing material 32 of the lower support base substrate 16. The ball-shaped terminals 20 can be formed of a solder material, for example, and by some existing method.

Figure 12:
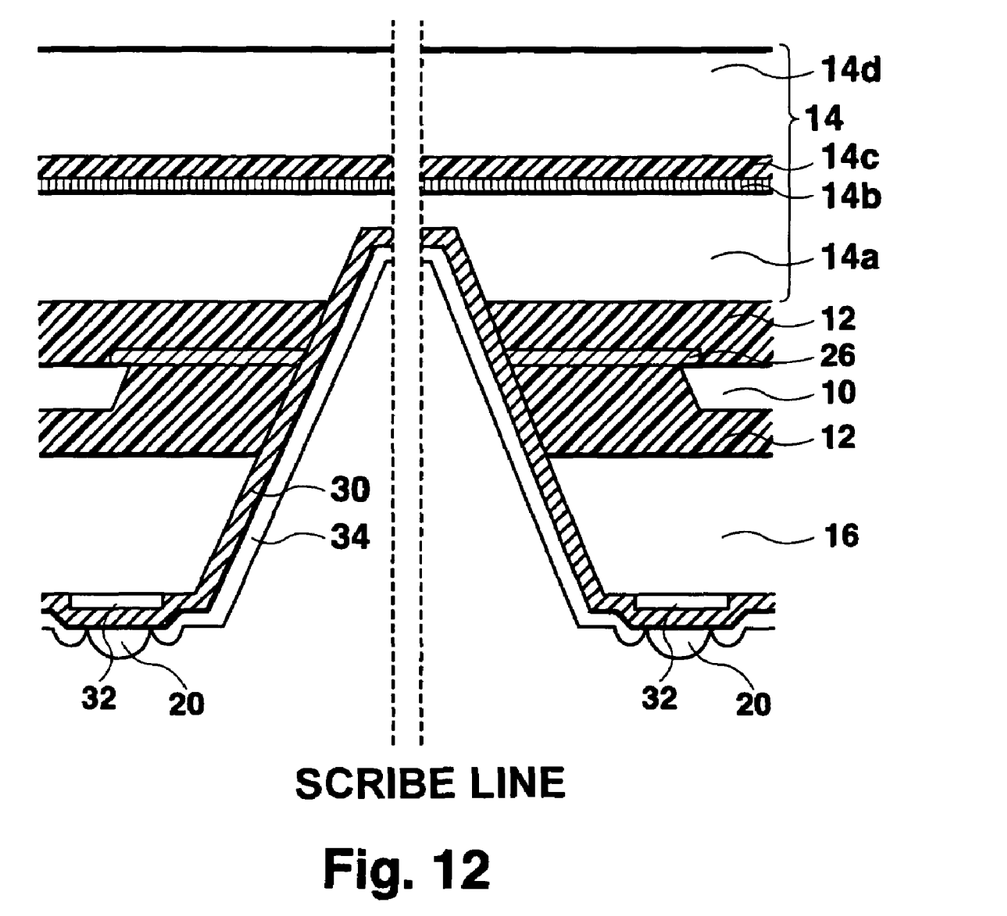
FIG. 12 shows a process of dicing into elements according to the second embodiment of the present invention.
Figure 13:
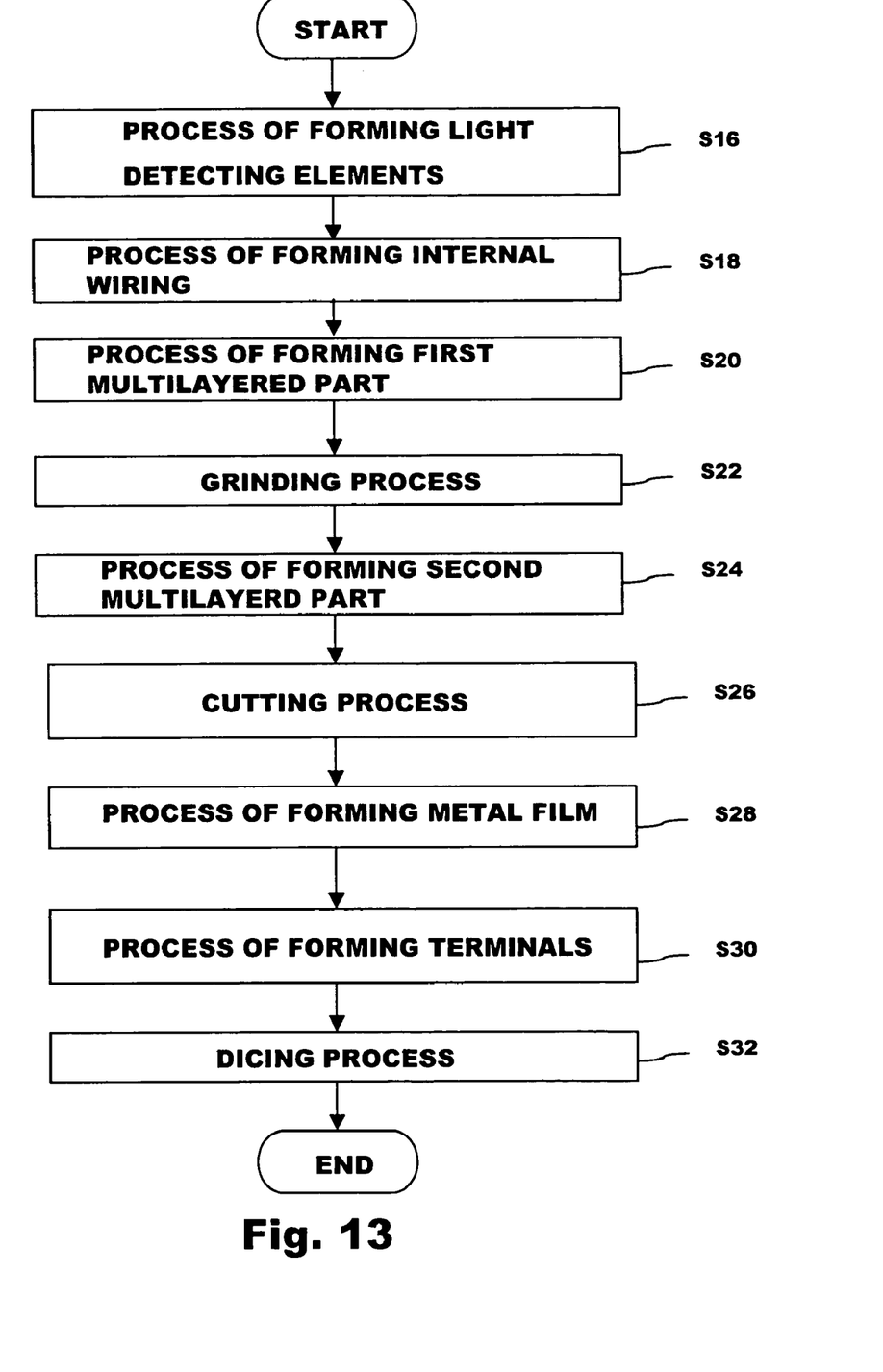
FIG. 13 is a flowchart in the second embodiment of the present invention.

In the dicing process in Step S32, as shown in FIG. 12, the multilayered structure is cut with a dicing saw, for example, at the bottom of the groove used as the scribe line to divide into individual solid-state image sensing elements.

Figure 14A:
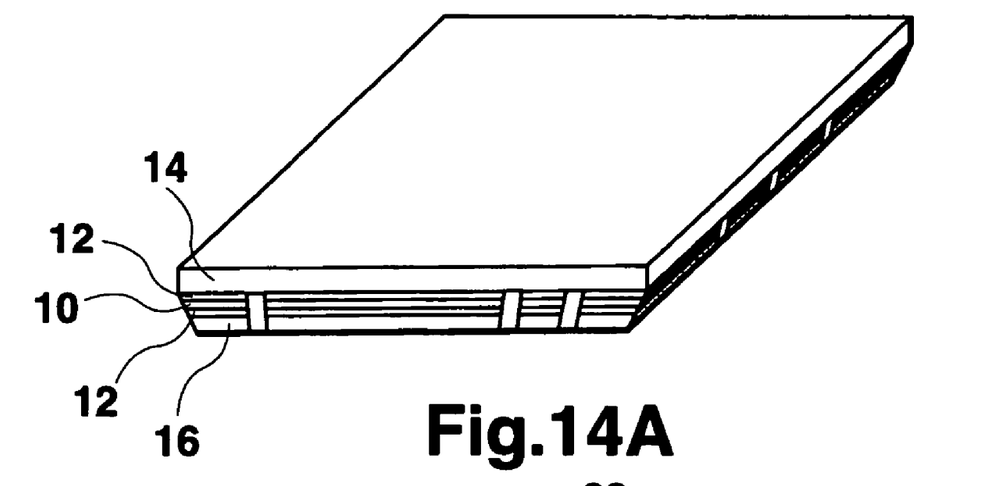
FIGS. 14A and 14B show external appearances of a solid-state image sensing device.
Figure 14B:
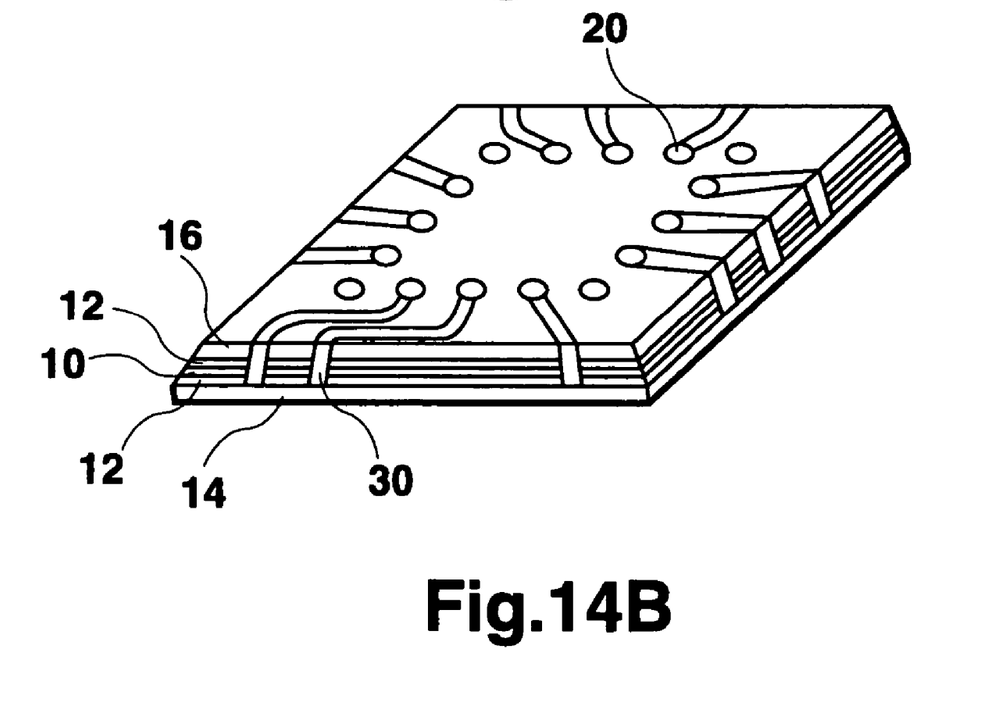

With the manufacturing method described above, a solid-state image sensing device in a chip-size package as shown in the external appearance of FIG. 14 is produced. This solid-state image sensing device is structured such that a semiconductor substrate 10, which has the light detecting elements formed in the upper surface thereof and the color filters deposited on the upper surface of the light detecting elements, is placed between an upper support base structure 14 and a lower support base structure 16, and external wiring lines 30 drawn out from the side faces of the package of the solid-state image sensing device are connected to the ball-shaped terminals provided on the rear side surface of the solid-state image sensing device. In this state, the upper support base structure also serves as the infrared cut-off filter.

As has been described, the solid-state image sensing element according to the present invention obviates the need to provide a separate infrared cut-off filter, and offers an advantage of reducing the constraints in the design of the optical system.

Note that the contents of the present patent application are disclosed in Japanese Patent Application No. 2003-187695, and can be understood from this patent application document.

The invention claimed is:

1. A method for manufacturing a solid-state image sensing device, comprising:
   a first process for forming light detecting elements on a surface of a semiconductor substrate in areas marked off by scribe lines and depositing color filters in such a manner as to cover said formed areas of said light detecting elements;
   a second process for forming a multilayered structure by directly fixing one surface of said color filters to one surface of an infrared cut-off filter by a translucent resin layer covering the formed areas of said light detecting elements; and
   a third process for dividing said multilayered structure into partitions by cutting along scribe-lines on said semiconductor substrate.

2. A method for manufacturing a solid-state image sensing device, comprising:
   a first process for forming light detecting elements on a semiconductor substrate in areas marked off by scribe lines and forming internal wiring extending toward said scribe lines between said adjacent light detecting elements;
   a second process for depositing color filters in such a manner as to cover said formed areas of said light detecting elements;
   a third process for depositing a translucent insulating resin layer covering the formed areas of said light detecting elements and directly fixing one surface of said color filters to one surface of an upper support base substrate by said translucent insulating resin layer, said upper support base structure transmitting visible light and cutting off infrared light;
   and removing part of said semiconductor substrate along the scribe lines, a fourth process for forming a multilayered structure having a lower support base substrate firmly fixed to the rear side surface of said semiconductor substrate by an insulating resin layer;
   a fifth process for forming grooves along said scribed lines to thereby expose part of said insulating resin and said internal wiring, leaving part of said upper support base substrate intact;
   a sixth process for forming a metal film over the rear side surface of said semiconductor substrate and said grooves and patterning said metal film to form external wiring; and
   a seventh process for dividing said multilayered structure by cutting along said scribe lines.

* * * * *